(12) United States Patent
Luo et al.

(10) Patent No.: US 11,882,757 B2
(45) Date of Patent: Jan. 23, 2024

(54) THERMALLY ACTIVATED DELAYED FLUORESCENCE GREEN POLYMER MATERIAL AND PREPARATION METHOD THEREOF

(71) Applicant: WUHAN CHINA STAR OPTOELECTRONICS SEMICONDUCTOR DISPLAY TECHNOLOGY CO., LTD., Hubei (CN)

(72) Inventors: Jiajia Luo, Hubei (CN); Shuxing Yan, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 835 days.

(21) Appl. No.: 16/968,923

(22) PCT Filed: Apr. 3, 2020

(86) PCT No.: PCT/CN2020/083246
§ 371 (c)(1),
(2) Date: Aug. 11, 2020

(87) PCT Pub. No.: WO2021/120450
PCT Pub. Date: Jun. 24, 2021

(65) Prior Publication Data
US 2021/0193926 A1    Jun. 24, 2021

(30) Foreign Application Priority Data
Dec. 18, 2019   (CN) .......................... 201911309897.5

(51) Int. Cl.
C09K 11/06 (2006.01)
H10K 85/30 (2023.01)
C07F 5/02 (2006.01)
C09K 11/02 (2006.01)

(52) U.S. Cl.
CPC ........... *H10K 85/322* (2023.02); *C07F 5/027* (2013.01); *C09K 11/02* (2013.01); *C09K 11/06* (2013.01); *C09K 2211/1007* (2013.01); *C09K 2211/1018* (2013.01)

(58) Field of Classification Search
CPC ....... H10K 85/322; C07F 5/027; C09K 11/02; C09K 11/06; C09K 2211/1007; C09K 2211/1018
See application file for complete search history.

(56) References Cited

U.S. PATENT DOCUMENTS

2018/0069182 A1    3/2018    Hatakeyama et al.

FOREIGN PATENT DOCUMENTS

| CN | 110003260 A | | 7/2019 |
|---|---|---|---|
| WO | 2015/102118 | * | 7/2015 |
| WO | 2015102118 A1 | | 7/2015 |
| WO | 2019009052 A1 | | 1/2019 |
| WO | 2019206288 A1 | | 10/2019 |
| WO | 2019/235452 | * | 12/2019 |
| WO | 2019235452 A1 | | 12/2019 |

* cited by examiner

*Primary Examiner* — D Margaret M Seaman
(74) *Attorney, Agent, or Firm* — PV IP PC; Wei Te Chung; Zhigang Ma

(57) ABSTRACT

A thermally activated delayed fluorescence green light polymer material and an organic electroluminescent device thereof are provided. The thermally activated delayed fluorescence green light polymer material is based on a boron-containing structure, an overall charge transfer strength is adjusted through different electron donor units, so as to synthesize a series of green light thermally activated delayed fluorescence materials with low single-triplet energy level differences, high luminous efficiency, and fast reverse intersystem crossing constants, while realizing the fine-tuning of the electron-donor ability of the electronic donor unit to make the spectrum fine-tune.

14 Claims, 1 Drawing Sheet

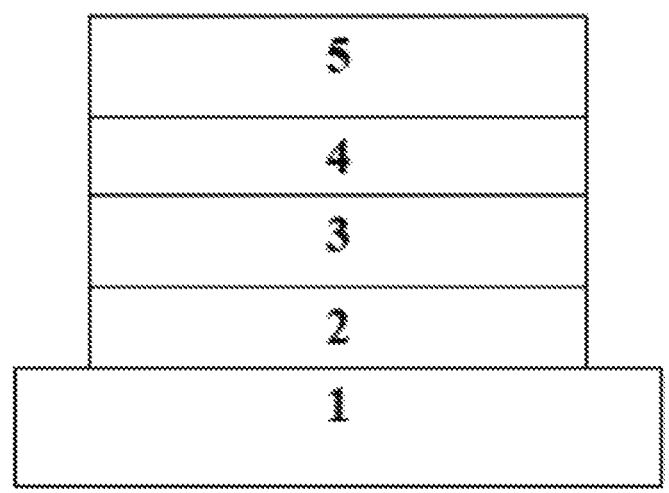

THERMALLY ACTIVATED DELAYED FLUORESCENCE GREEN POLYMER MATERIAL AND PREPARATION METHOD THEREOF

FIELD OF DISCLOSURE

The disclosure relates to technical fields of organic photoelectric materials, in particular to thermally activated delayed fluorescent green light polymer materials and preparation methods thereof.

BACKGROUND OF DISCLOSURE

Organic light emitting diodes (OLED) attract attention of many researchers because of its advantages, such as active Illumination without backlight, high luminous efficiency, large viewing angles, fast response times, wide temperature ranges, relatively simple production and processing technology, low driving voltage, small energy consumption, lighter and thinner, flexible display, and so on. In OLEDs, the dominant luminescent guest material is very important. The luminescence subject material used in early OLEDs was fluorescent materials. Because the exciton ratio of singlet state and triplet state in OLEDs is 1:3, the theoretical internal quantum efficiency (IQE) of OLEDs based on fluorescent materials can only reach 25%, which greatly restricts the application of fluorescent electroluminescent devices.

Due to the spin orbit coupling of heavy atoms, heavy metal complex phosphorescent materials can utilize singlet state and triplet state excitons simultaneously to achieve 100% IQE. However, commonly used heavy metals are precious metals such as iridium (Ir) and platinum, and the breakthrough of the phosphorescent luminescent materials based on heavy metal complexes is needed in the field of blue light materials. Pure organic thermally activated delayed fluorescence (TADF) materials, through ingenious molecular design, make the molecules to have a small minimum singlet state and triplet state energy difference (ΔEST), so that the triplet state exciton can return to the singlet state through reverse intersystem crossing (RISC), and then emits light by transitioning to the ground state through radiation, so that the singlet state and triplet state excitons can be used at the same time, and 100% IQE can be achieved.

For the TADF materials, fast reverse intersystem crossing constant (kRISC) and high photoluminescence quantum yield (PLQY) are the necessary requirements for the preparation of high efficiency OLED. Currently, compared with the heavy metal Ir complexes, TADF materials satisfying the above requirements are still scarce.

Therefore, it is necessary to develop a TADF polymer to overcome the defects of the prior art.

SUMMARY OF DISCLOSURE

Technical problems: The object of the present disclosure is to provide a thermally activated delayed fluorescent green light polymer material, a preparation method and application thereof to solve the problem of low luminous efficiency of organic light emitting diodes in the prior art.

To achieve the above objects, the present disclosure provides a thermally activated delayed fluorescent green light polymer material, the structural formula of which is as follows:

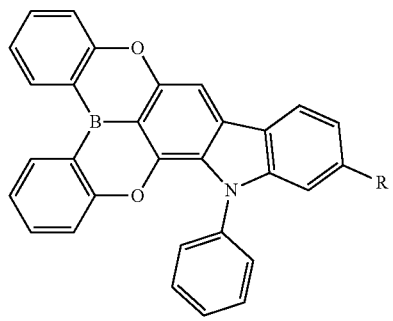

wherein in the formula, R is a benzene compound with a nitrogen-containing ring structure.

In different embodiments, the benzene compound with the nitrogen-containing ring structure is selected one of following structural formulas:

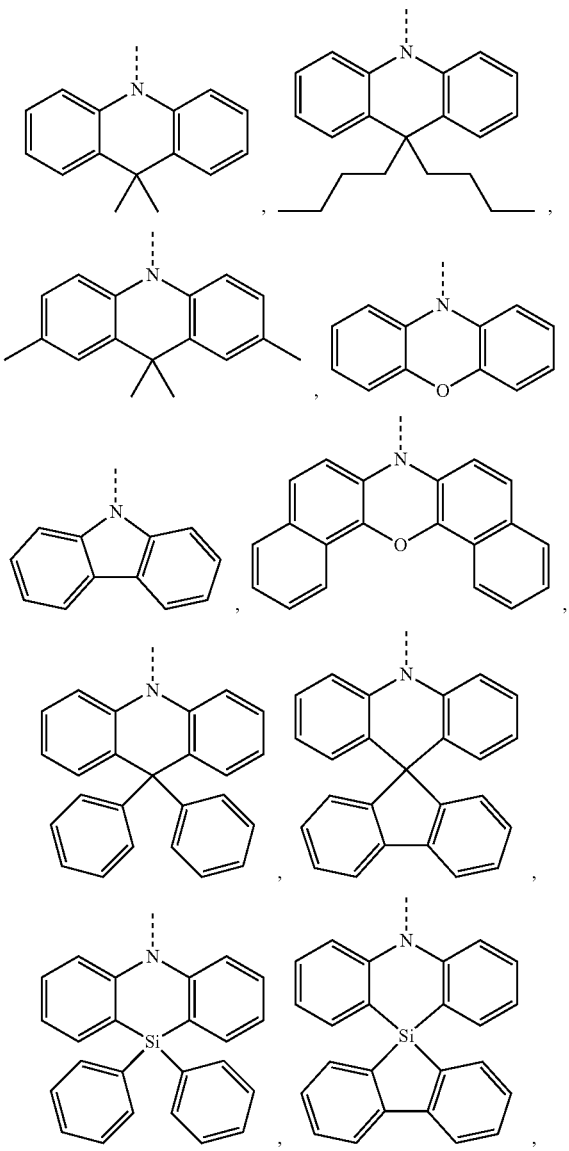

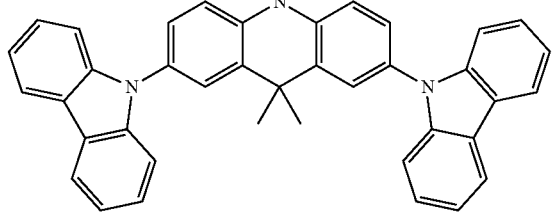
,
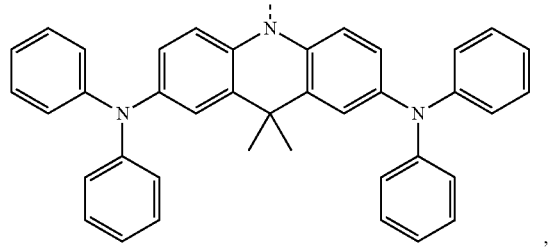
,
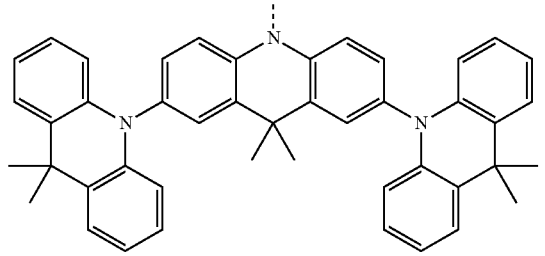
,
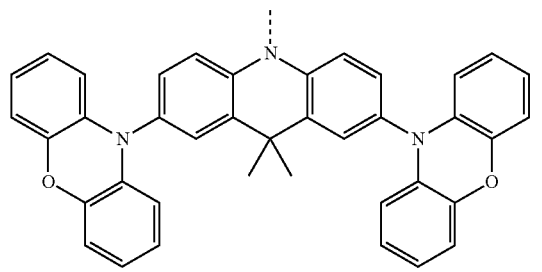
,
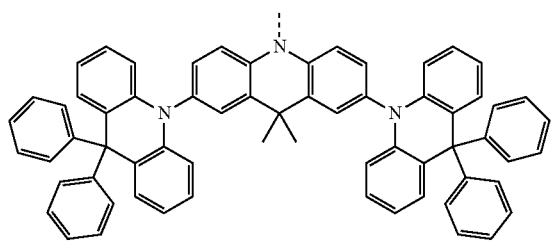
,
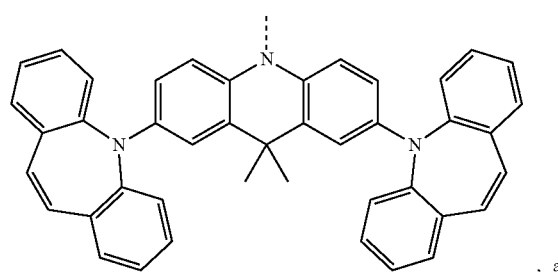
, and
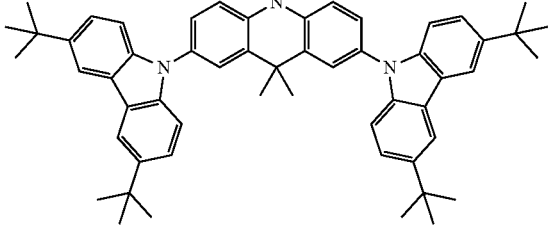
,
Furthermore, in different embodiments, the R is
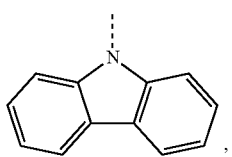
,
and a chemical structural formula of the thermally activated delayed fluorescent green light polymer material is:
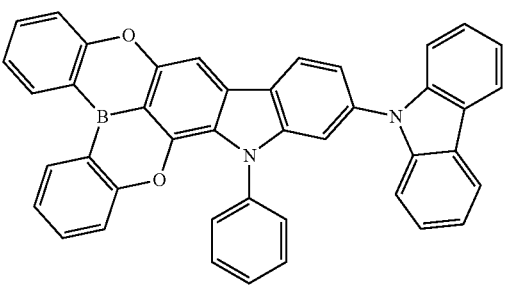
.
Furthermore, in different embodiments, the R is
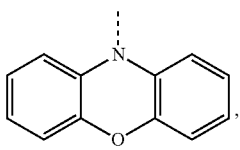
,
and a chemical structural formula of the thermally activated delayed fluorescent green light polymer material is:
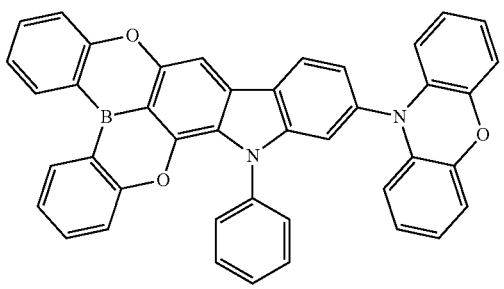
.

Furthermore, in different embodiments, the R is

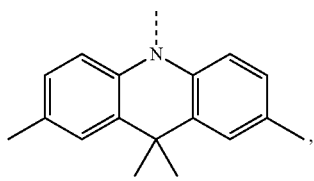

and a chemical structural formula of the thermally activated delayed fluorescent green light polymer material is:

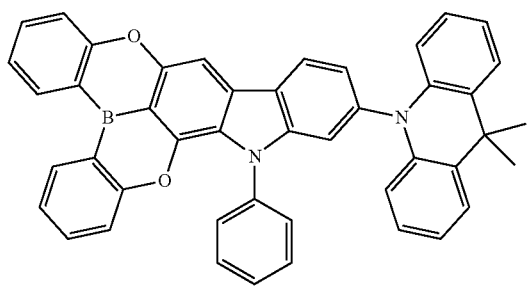

The present disclosure further provides a preparation method for preparing the thermally activated delayed fluorescent green light polymer material according to the present disclosure, including following steps of:

adding a benzene compound with a boron ring structure, a benzene compound with a nitrogen ring structure, palladium acetate, and tri-tert-butyl phosphine tetrafluoroborate into a reaction bottle, wherein in the benzene compound with the nitrogen ring structure, the nitrogen ring structure forms an amino group; and a chemical structural formula of the benzene compound with the boron ring structure is as follows:

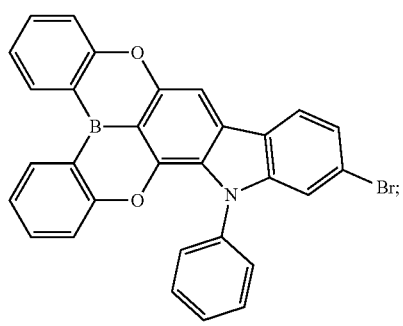 [SMILES: Brc1ccc2c3cc4c5c(c3n(-c3ccccc3)c2c1)Oc1ccccc1B5c1ccccc1O4]

placing the reaction bottle into a glove box, and adding NaOt-Bu to the reaction bottle in the glove box, and further adding toluene under an argon atmosphere, followed by reacting at 100-140° C. for 20 to 30 hours, and cooling to a room temperature to obtain a mixed solution; and pouring the mixed solution into an ice water, extracting organic phases from the mixed solution multiple times with dichloromethane, combining the organic phases extracted by the multiple times, and separating and purifying the extracted organic phases by a silica gel chromatography to obtain the thermally activated delayed fluorescent green light polymer material.

Furthermore, in different embodiments, the benzene compound with the nitrogen-containing ring structure is selected one of following structural formulas:

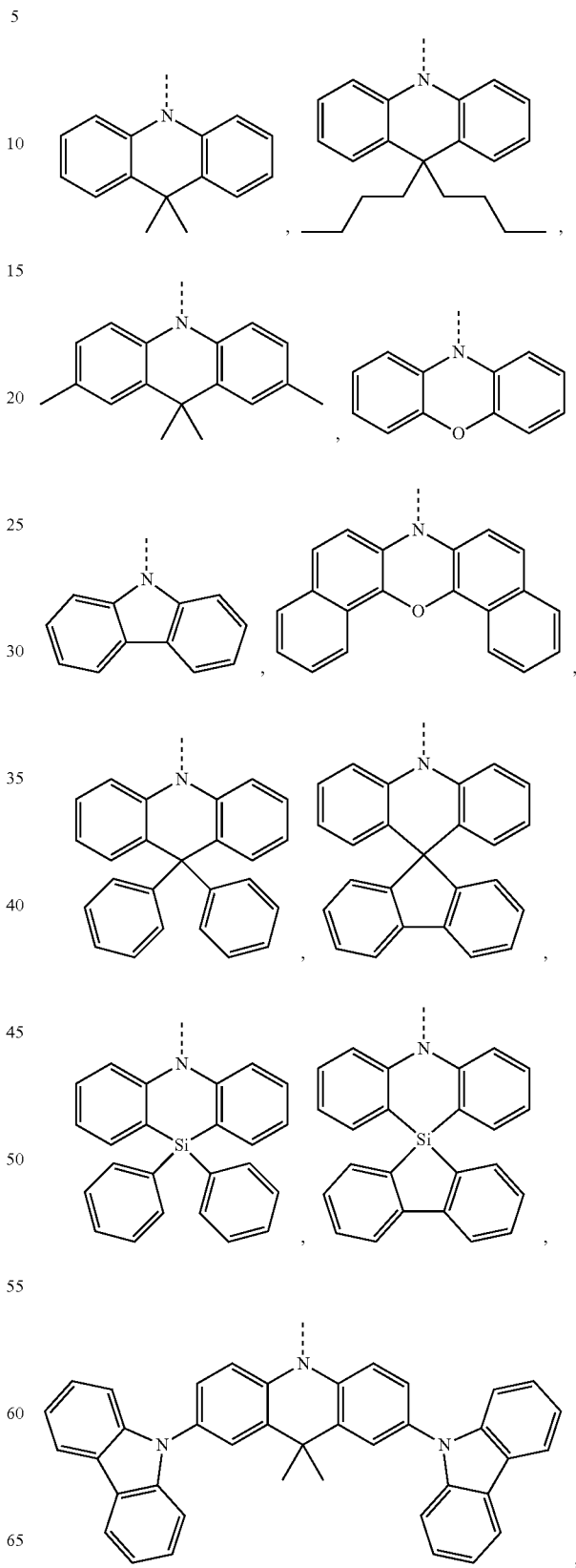

-continued

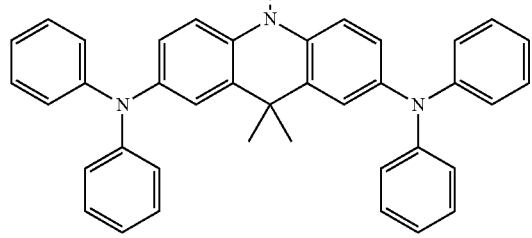

,

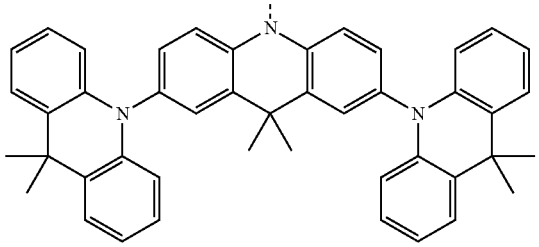

,

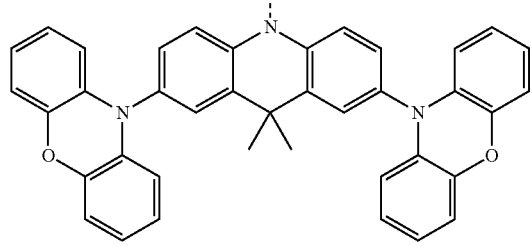

,

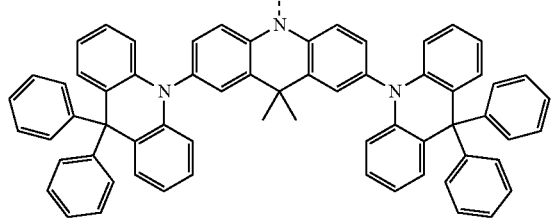

,

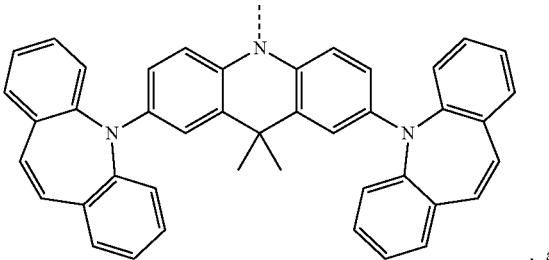

, and

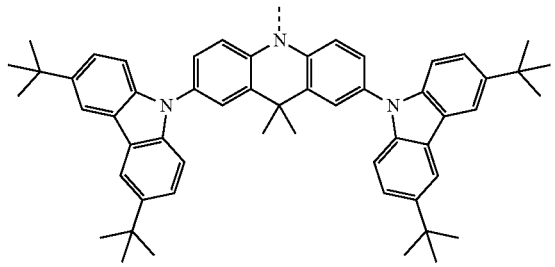

.

Furthermore, in different embodiments, when the benzene compound with the nitrogen-containing ring structure is carbazole, and a chemical structural formula of the carbazole is

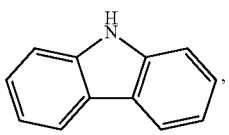 [SMILES: c1ccc2c(c1)[nH]c1ccccc12]

, a chemical structural formula of the thermally activated delayed fluorescent green light polymer material is:

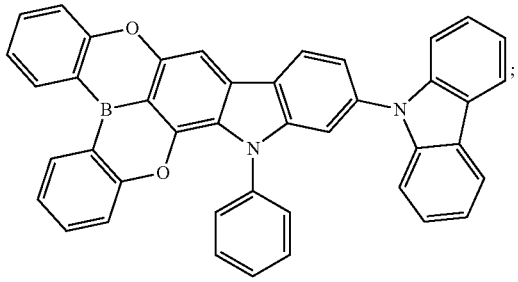 [SMILES: c1ccc(-n2c3cc(-n4c5ccccc5c5ccccc54)ccc3c3cc4c5c(c32)Oc2ccccc2B5c2ccccc2O4)cc1]

;

when the benzene compound with the nitrogen-containing ring structure is phenoxazine, and a chemical structural formula of the phenoxazine is

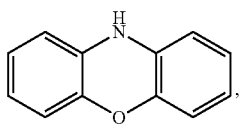

, a chemical structural formula of the thermally activated delayed fluorescent green light polymer material is:

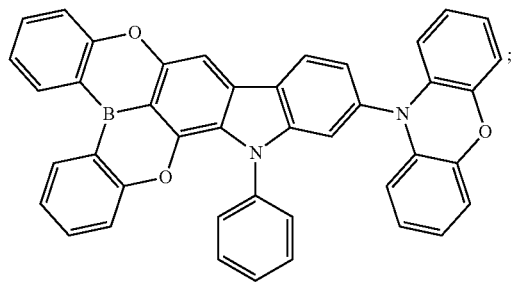 [SMILES: c1ccc(-n2c3cc(N4c5ccccc5Oc5ccccc54)ccc3c3cc4c5c(c32)Oc2ccccc2B5c2ccccc2O4)cc1]

;

and
when the benzene compound with the nitrogen-containing ring structure is 9,9'-dimethylacridine, and a chemical structural formula of the 9,9'-dimethylacridine is:

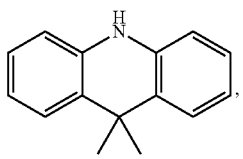

, a chemical structural formula of the thermally activated delayed fluorescent green light polymer material is:

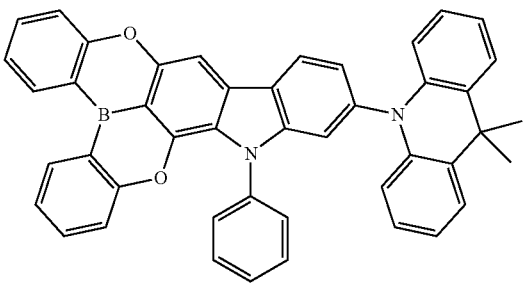

Furthermore, in different embodiments, a molar mass ratio of the benzene compound with the boron ring structure, the benzene compound with the nitrogen ring structure, the palladium acetate, and the tri-tert-butyl phosphine tetrafluoroborate is: (12-15):(15-20):(1-1.5):(3-4).

The present disclosure also provides an organic electroluminescent device, including a light-emitting layer containing the thermally activated delayed fluorescent green light polymer material according to the present disclosure.

The organic electroluminescent device includes a glass and conductive glass (ITO) substrate layer, a hole transport and injection layer, the light emitting layer, an electron transport layer, and a cathode layer.

Beneficial effect: Compared with the prior art, the beneficial effect of the present disclosure is that: the present disclosure relates to a thermally activated delayed fluorescent green light polymer material, wherein based on a boron-containing structure, an overall charge transfer strength is adjusted through different electron donor units, so as to synthesize a series of green light thermally activated delayed fluorescence materials with low single-triplet energy level differences, high luminous efficiency, and fast reverse intersystem crossing constants, while realizing the fine-tuning of the electron-donor ability of the electronic donor unit to make the spectrum fine-tune.

Furthermore, the present disclosure also provides an organic electroluminescent device that uses the thermally activated delayed fluorescent green light polymer material as a light-emitting layer, which can improve the luminous efficiency of the device and make the performance of the light-emitting device more stable.

DRAWINGS

The technical solutions and other beneficial effects of the present application will be apparent through the detailed description of the specific implementation of the present application in conjunction with the drawings.

FIG. 1 is a schematic structural view of an organic electroluminescent device according to an embodiment of the present disclosure.

DETAILED DESCRIPTION OF EMBODIMENTS

The technical solutions in the embodiments of the present disclosure will be described clearly and completely in conjunction with the drawings in the embodiments of the present disclosure. It is apparent that the described embodiments are only a part of the embodiments of the present disclosure, but not all the embodiments. Based on the embodiments of the present disclosure, all other embodiments obtained by those of ordinary skill in the art without making creative works fall within the protection scope of the present disclosure.

The present disclosure provides a thermally activated delayed fluorescent green light polymer material, a structural formula is as follows:

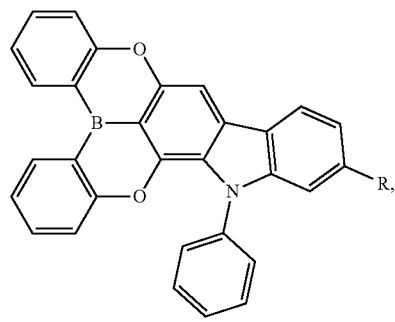

In the formula, R is a benzene compound with a nitrogen-containing ring structure, and the benzene compound with the nitrogen-containing ring structure is one of following structural formulas:

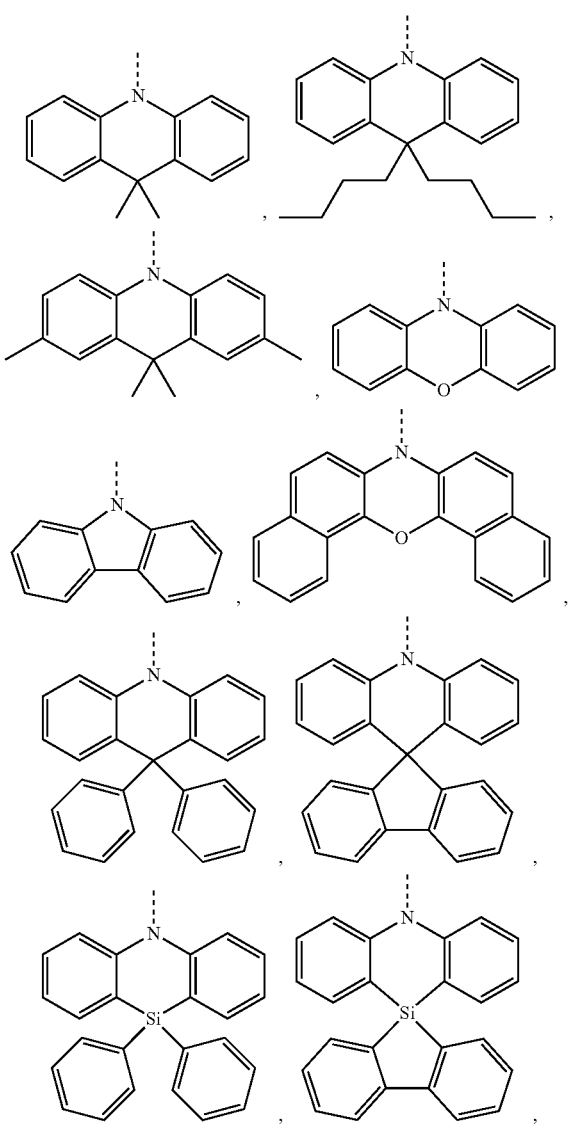

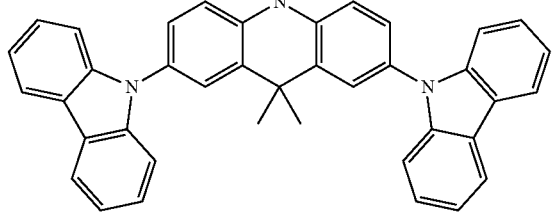
,
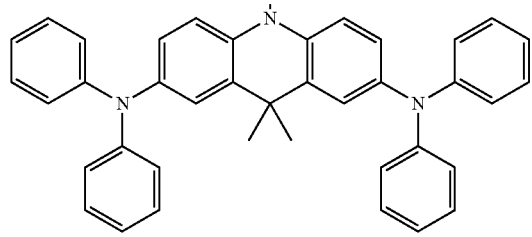
,
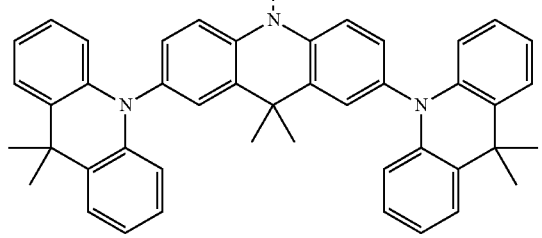
,
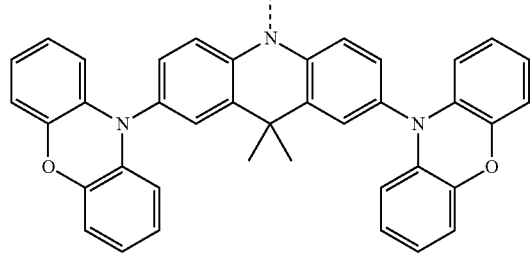
,
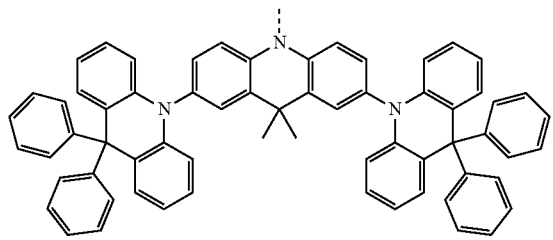
, and
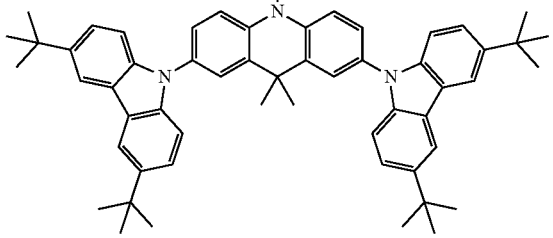
.
When the R is
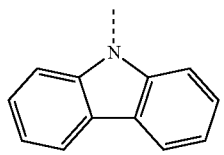
A chemical structural formula of the thermally activated delayed fluorescent green light polymer material is:
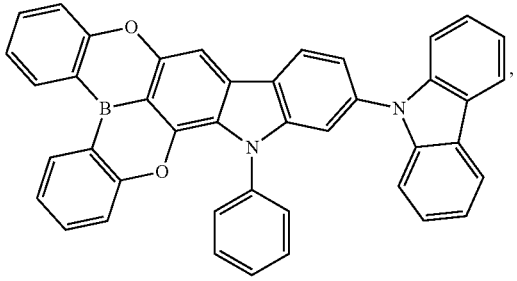 [SMILES: c1ccc(-n2c3cc(-n4c5ccccc5c5ccccc54)ccc3c3cc4c5c(c32)Oc2ccccc2B5c2ccccc2O4)cc1]
,
which is compound A;
When R is
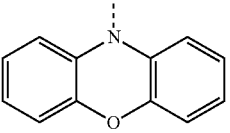
A chemical structural formula of the thermally activated delayed fluorescent green light polymer material is:
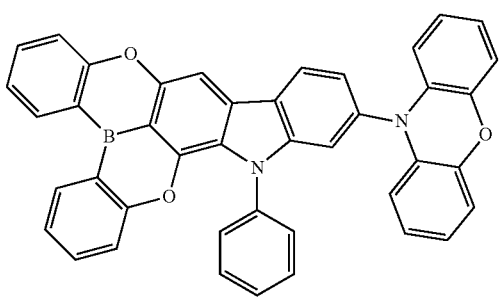
,
which is compound B;

When R is

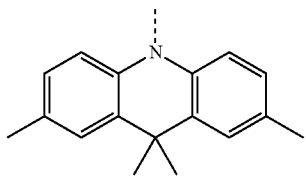

A chemical structural formula of the thermally activated delayed fluorescent green light polymer material is:

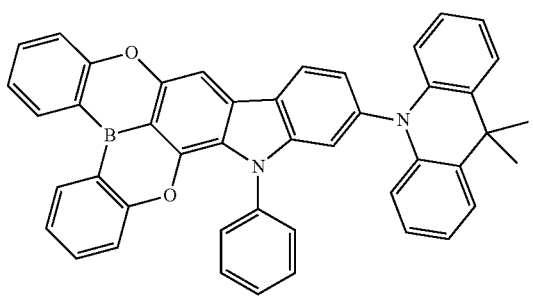, which is compound C.

The lowest singlet state (S1), lowest triplet state level (T1), and electrochemical energy level of compound A, compound B, and compound C are shown in Table 1 below.

TABLE 1

|  | PL Peak (nm) | $S_1$ (eV) | $T_1$ (eV) | $\Delta E_{ST}$ (eV) | HOMO (eV) | LUMO (eV) |
| --- | --- | --- | --- | --- | --- | --- |
| compound A | 520 | 2.39 | 2.30 | 0.09 | −5.46 | −2.87 |
| compound B | 543 | 2.29 | 2.18 | 0.11 | −5.48 | −2.87 |
| compound C | 529 | 2.34 | 2.28 | 0.06 | −5.41 | −2.87 |

The present disclosure further provides a preparation method for preparing the thermally activated delayed fluorescent green light polymer material according to the present disclosure, including following steps of:

adding a benzene compound with a boron ring structure, a benzene compound with a nitrogen ring structure, palladium acetate, and tri-tert-butyl phosphine tetrafluoroborate into a reaction bottle, wherein in the benzene compound with the nitrogen ring structure, the nitrogen ring structure forms an amino group; and a chemical structural formula of the benzene compound with the boron ring structure is as follows:

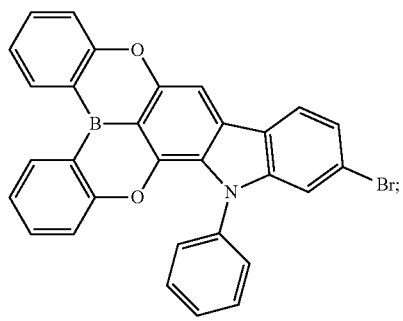 [SMILES: Brc1ccc2c3cc4c5c(c3n(-c3ccccc3)c2c1)Oc1ccccc1B5c1ccccc1O4]

placing the reaction bottle into a glove box, and adding NaOt-Bu to the reaction bottle in the glove box, and further adding toluene under an argon atmosphere, followed by reacting at 100-140° C. for 20 to 30 hours, and cooling to a room temperature to obtain a mixed solution; and pouring the mixed solution into an ice water, extracting organic phases from the mixed solution multiple times with dichloromethane, combining the organic phases extracted by the multiple times, and separating and purifying the extracted organic phases by a silica gel chromatography to obtain the thermally activated delayed fluorescent green light polymer material.

Method Example 1

In this embodiment, the benzene compound with the nitrogen-containing ring structure is carbazole, and a chemical structural formula of the carbazole is

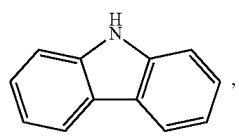 [SMILES: c1ccc2c(c1)[nH]c1ccccc12],

A chemical structural formula of the thermally activated delayed fluorescent green light polymer material is:

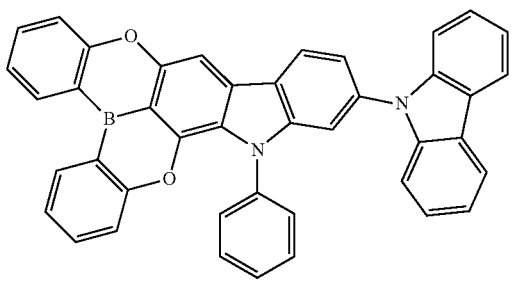;

The synthetic path is as follows:

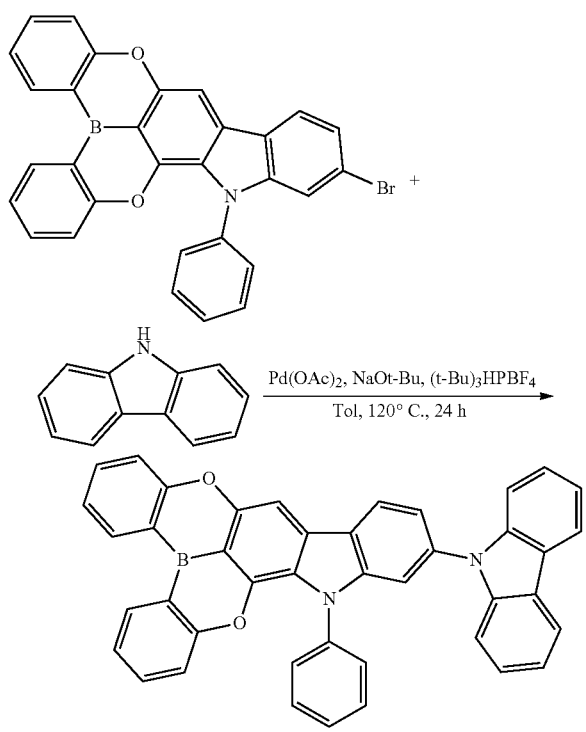

The preparation method of the thermally activated delayed fluorescent green light polymer material includes the following steps:

Adding 5 mmol of benzene compound with a boron ring structure, 6 mmol of carbazole, 0.4 mmol of palladium acetate and 1.2 mmol of tri-tert-butyl phosphine tetrafluoroborate into a reaction bottle, and placing the reaction bottle into a glove box, and adding 12 mmol NaOt-Bu in the glove box, adding 120 mL of toluene that has been dehydrated and deoxygenated under the argon atmosphere, followed by reacting at 100-140° C. for 20 to 30 hours, then cool to a room temperature to obtain a mixed solution, pouring the mixed solution into 300 mL of ice water, extracting the organic phase in the mixed solution multiple times with dichloromethane, combining the organic phases extracted by multiple times, and separating and purifying it by a silica gel chromatography to obtain 2.0 g of the thermally activated delayed fluorescent green light polymer material, wherein the yield is 67%.

Method Example 2

In this embodiment, the benzene compound with a nitrogen-containing ring structure is phenoxazine, and a chemical structural formula of the phenoxazine is

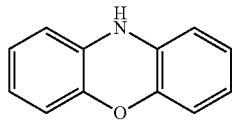 [SMILES: c1ccc2c(c1)Nc1ccccc1O2]

A chemical structural formula of the thermally activated delayed fluorescent green light polymer material is:

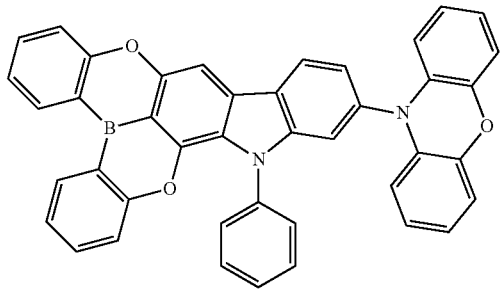 [SMILES: c1ccc(-n2c3cc(N4c5ccccc5Oc5ccccc54)ccc3c3cc4c5c(c32)Oc2ccccc2B5c2ccccc2O4)cc1]

The synthetic path is as follows:

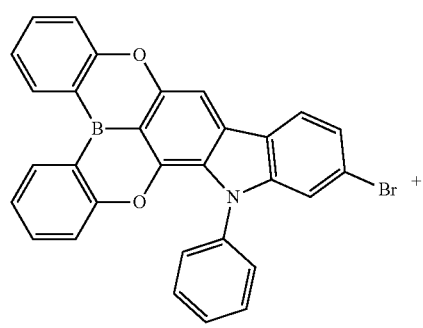

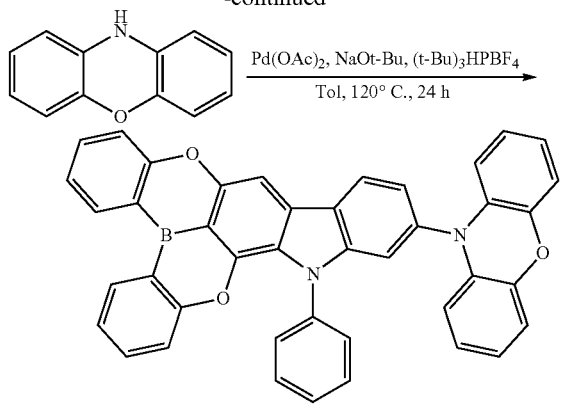

The preparation method of the thermally activated delayed fluorescent green light polymer material includes the following steps:

Adding 5 mmol of benzene compound with a boron ring structure, 6 mmol of phenoxazine, 0.4 mmol of palladium acetate and 1.2 mmol of tri-tert-butyl phosphine tetrafluoroborate into a reaction bottle, and placing the reaction bottle into a glove box, and adding 12 mmol NaOt-Bu in the glove box, adding 120 mL of toluene that has been dehydrated and deoxygenated under the argon atmosphere, followed by reacting at 100-140° C. for 20 to 30 hours, then cool to a room temperature to obtain a mixed solution, pouring the mixed solution into 300 mL of ice water, extracting the organic phase in the mixed solution multiple times with dichloromethane, combining the organic phases extracted by multiple times, and separating and purifying it by a silica gel chromatography to obtain 2.2 g of the thermally activated delayed fluorescent green light polymer material, wherein the yield is 71%.

Method Example 3

In this embodiment, the benzene compound with a nitrogen-containing ring structure is 9,9'-dimethylacridine, and a chemical structure of the 9,9'-dimethylacridine is

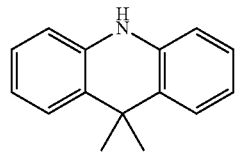 [SMILES: CC1(C)c2ccccc2Nc2ccccc21]

A chemical structural formula of the thermally activated delayed fluorescent green light polymer material is:

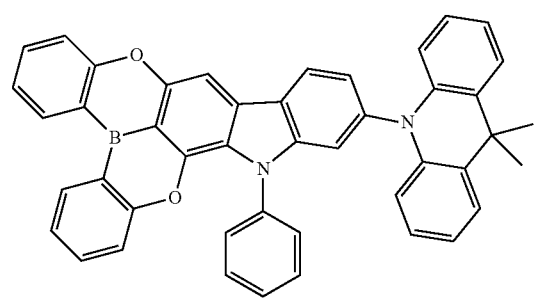 [SMILES: CC1(C)c2ccccc2N(c2ccc3c4cc5c6c(c4n(-c4ccccc4)c3c2)Oc2ccccc2B6c2ccccc2O5)c2ccccc21]

The synthetic path is as follows:

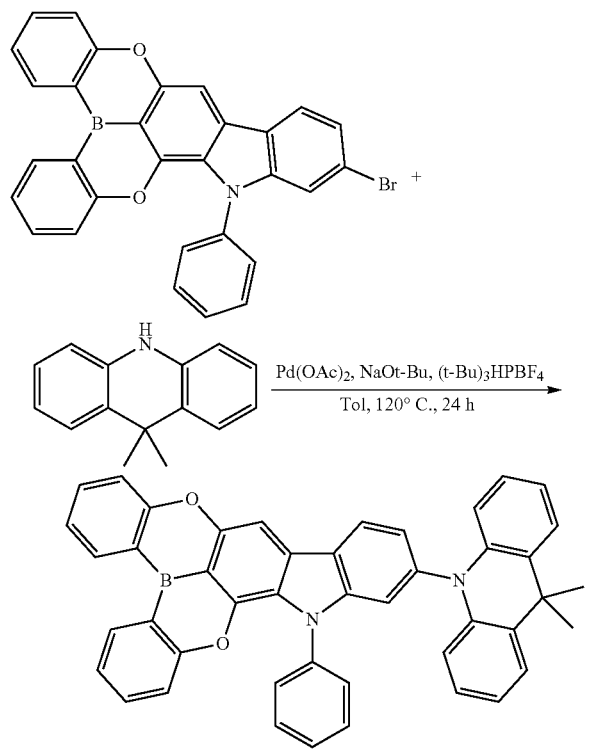

The preparation method of the thermally activated delayed fluorescent green light polymer material includes following steps:

Adding 5 mmol of benzene compound with a boron ring structure, 6 mmol of 9,9'-dimethylacridine, 0.4 mmol of palladium acetate and 1.2 mmol of tri-tert-butyl phosphine tetrafluoroborate into a reaction bottle, and placing the reaction bottle into a glove box, and adding 12 mmol NaOt-Bu in the glove box, and adding 12 mmol NaOt-Bu in the glove box, adding 120 mL of toluene that has been dehydrated and deoxygenated under the argon atmosphere, followed by reacting at 100-140° C. for 20 to 30 hours, then cool to a room temperature to obtain a mixed solution, pouring the mixed solution into 300 mL of ice water, extracting the organic phase in the mixed solution multiple times with dichloromethane, combining the organic phases extracted by multiple times, and separating and purifying it by a silica gel chromatography to obtain 2.3 g of the thermally activated delayed fluorescent green light polymer material, wherein the yield is 72%.

The present disclosure further provides an organic electroluminescent device, including a light-emitting layer containing the thermally activated delayed fluorescent green light polymer material according to the present disclosure.

Please refer to FIG. 1. FIG. 1 is a schematic structural view of an organic electroluminescent device provided by the present disclosure. The organic electroluminescent device includes a glass and conductive glass (ITO) substrate layer 1, a hole transport and injection layer 2, and a light emitting layer 3, a electron transport layer 4, and a cathode layer 5.

When the light-emitting layer 3 contains compound A, compound B, and compound C, the organic electroluminescent devices are respectively device 1, device 2, and device 3, and the performance data of device 1, device 2, and device 3 are shown in Table 2 below:

| Device | Maximum current efficiency (cd/A) | EL peak (nm) | Maximum external quantum efficiency (%) |
| --- | --- | --- | --- |
| Device 1 | 71.3 | 520 | 24.9 |
| Device 2 | 66.3 | 543 | 22.1 |
| Device 3 | 68.6 | 529 | 23.3 |

Compared with the prior art, the beneficial effect of the present disclosure is that: the present disclosure relates to a thermally activated delayed fluorescent green light polymer material, wherein based on a boron-containing structure, an overall charge transfer strength is adjusted through different electron donor units, so as to synthesize a series of green light thermally activated delayed fluorescence materials with low single-triplet energy level differences, high luminous efficiency, and fast reverse intersystem crossing constants, while realizing the fine-tuning of the electron-donor ability of the electronic donor unit to make the spectrum fine-tune.

Furthermore, the present disclosure also provides an organic electroluminescent device that uses the thermally activated delayed fluorescent green light polymer material as a light-emitting layer, which can improve the luminous efficiency of the device and make the performance of the light-emitting device more stable.

The above description is only the preferred embodiment of the present disclosure. It should be noted that for those of ordinary skill in the art, without departing from the principles of the present disclosure, many improvements and retouches can be made. These improvements and retouches should also be regarded as the disclosure.

The invention claimed is:

1. A thermally activated delayed fluorescent green light polymer material, comprising a structural formula as follows:

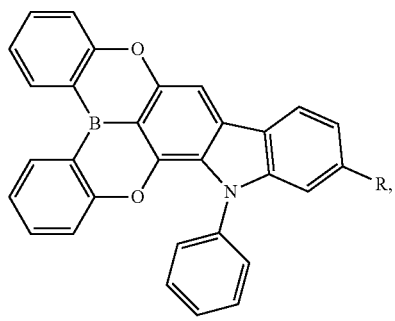

wherein in the formula, R is a benzene compound with a nitrogen-containing ring structure.

2. The thermally activated delayed fluorescent green light polymer material according to claim 1, wherein the benzene compound with the nitrogen-containing ring structure is selected one of following structural formulas:

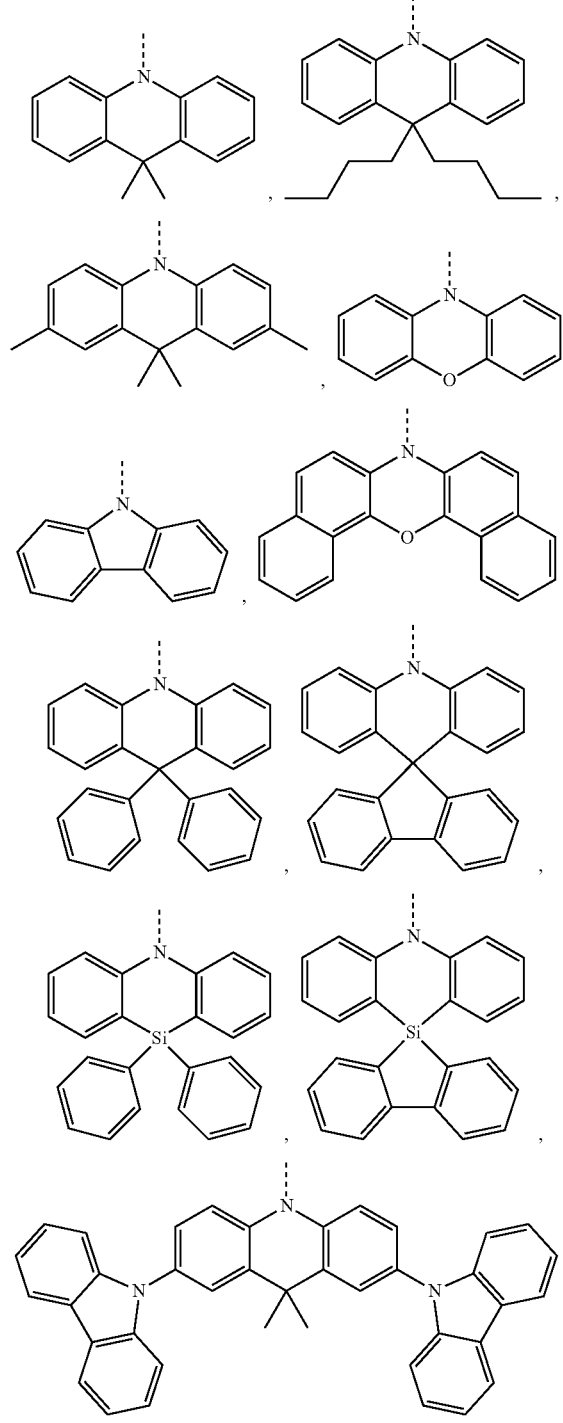
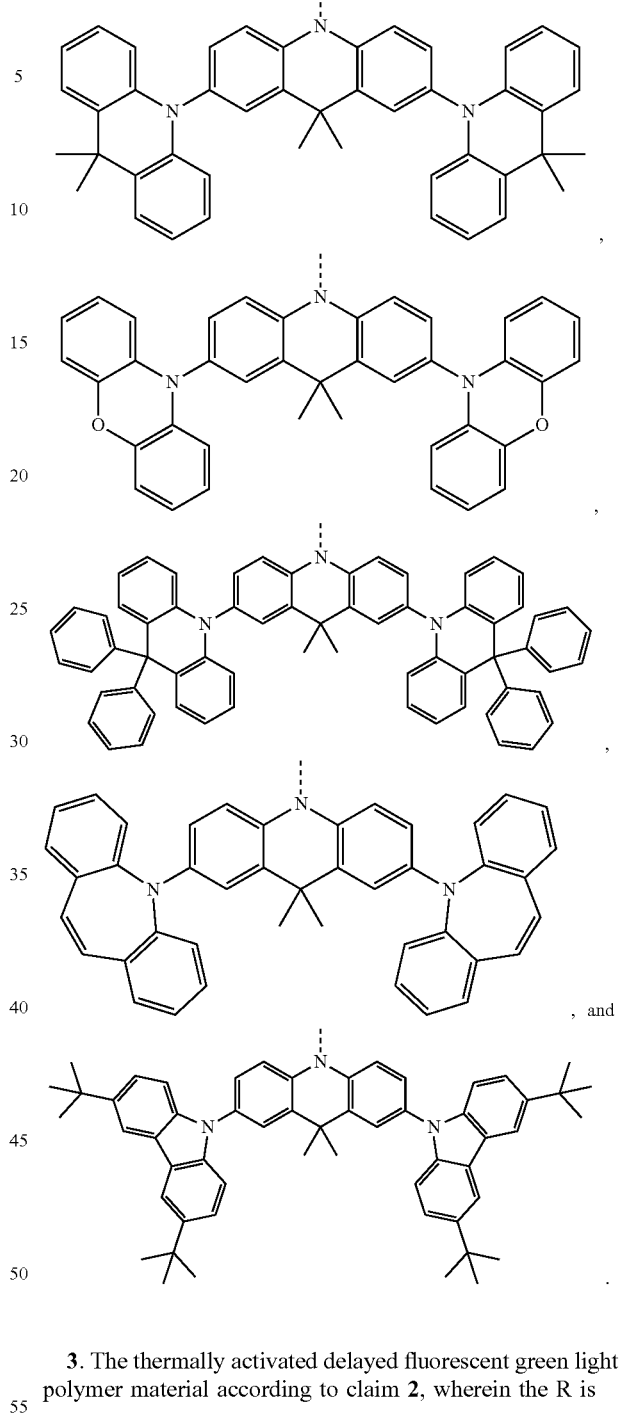
3. The thermally activated delayed fluorescent green light polymer material according to claim 2, wherein the R is
and
a chemical structural formula of the thermally activated delayed fluorescent green light polymer material is:

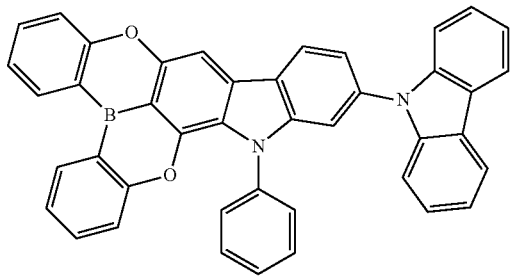

4. A thermally activated delayed fluorescent green light polymer material according to claim 2, wherein the R is

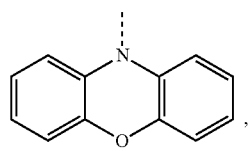, and a chemical structural formula of the thermally activated delayed fluorescent green light polymer material is:

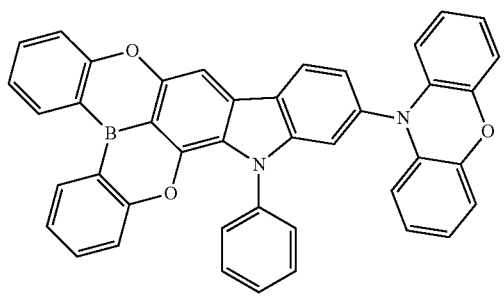.

5. A thermally activated delayed fluorescent green light polymer material according to claim 2, wherein the R is

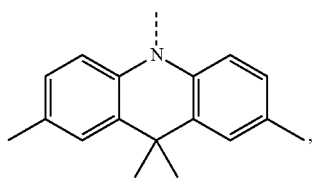, and a chemical structural formula of the thermally activated delayed fluorescent green light polymer material is:

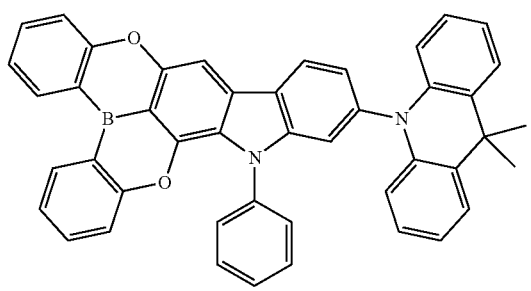.

6. A preparation method for preparing the thermally activated delayed fluorescent green light polymer material according to claim 1, comprising following steps of:

adding a benzene compound with a boron ring structure, a benzene compound with a nitrogen ring structure, palladium acetate, and tri-tert-butyl phosphine tetrafluoroborate into a reaction bottle, wherein in the benzene compound with the nitrogen ring structure, the nitrogen ring structure forms an amino group; and a chemical structural formula of the benzene compound with the boron ring structure is as follows:

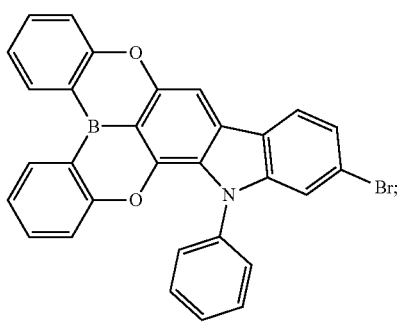 [SMILES: Brc1ccc2c3cc4c5c(c3n(-c3ccccc3)c2c1)Oc1ccccc1B5c1ccccc1O4]

placing the reaction bottle into a glove box, and adding NaOt-Bu to the reaction bottle in the glove box, and further adding toluene under an argon atmosphere, followed by reacting at 100-140° C. for 20 to 30 hours, and cooling to a room temperature to obtain a mixed solution; and pouring the mixed solution into an ice water, extracting organic phases from the mixed solution multiple times with dichloromethane, combining the organic phases extracted by the multiple times, and separating and purifying the extracted organic phases by a silica gel chromatography to obtain the thermally activated delayed fluorescent green light polymer material.

7. The preparation method for preparing the thermally activated delayed fluorescent green light polymer material according to claim 6, wherein the benzene compound with the nitrogen-containing ring structure is selected one of following structural formulas:

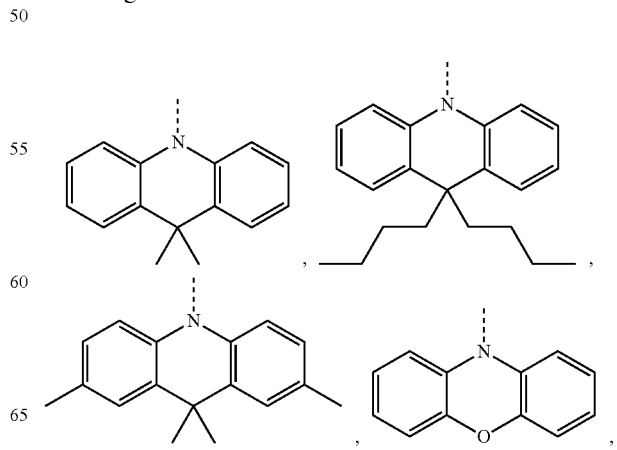

-continued

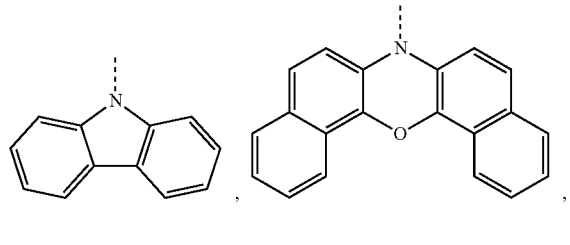

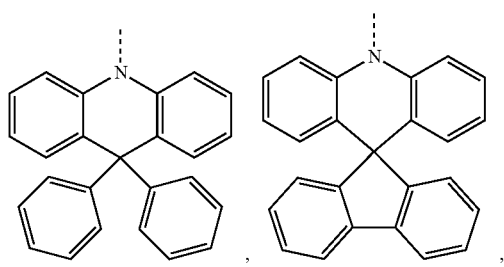

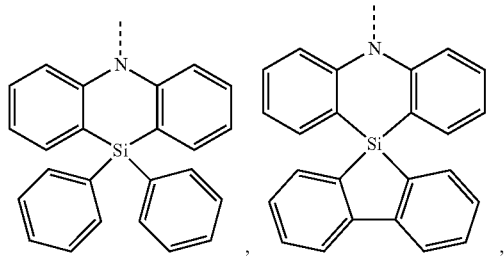

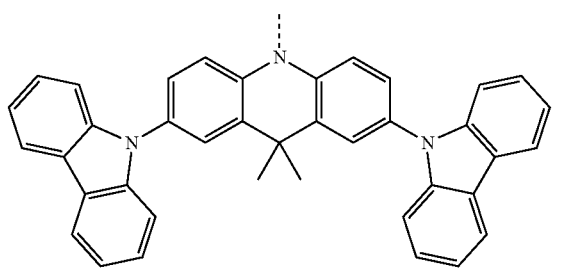

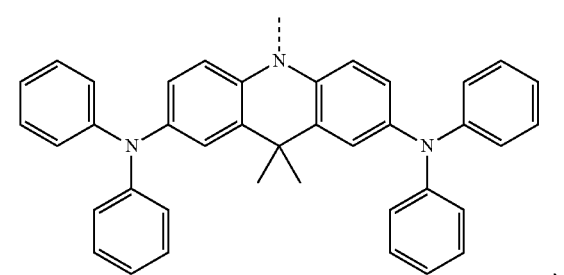

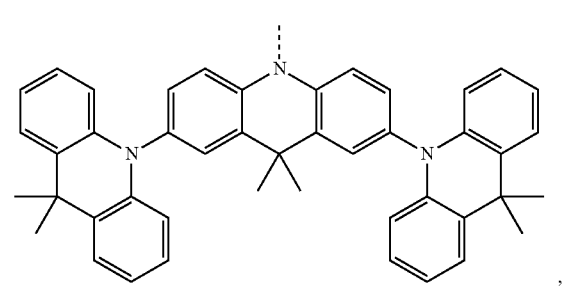

-continued

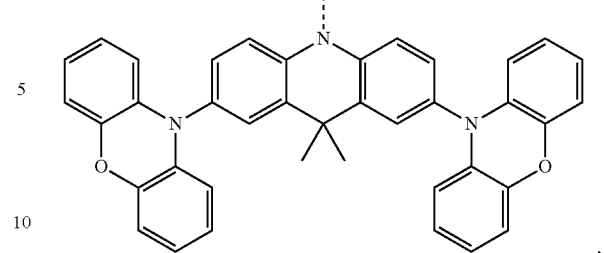

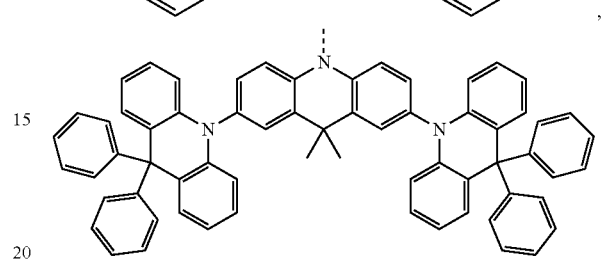

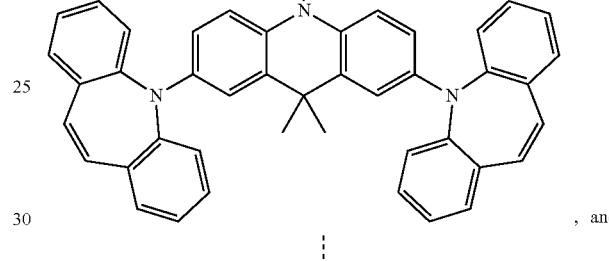

, and

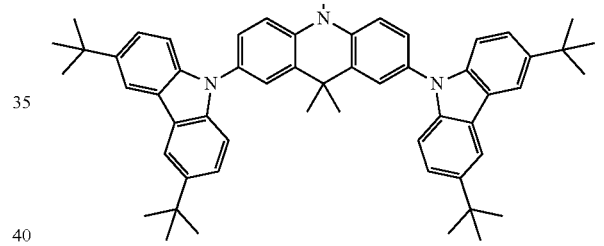

.

8. The preparation method for preparing the thermally activated delayed fluorescent green light polymer material according to claim 7, wherein when the benzene compound with the nitrogen-containing ring structure is carbazole, and a chemical structural formula of the carbazole is

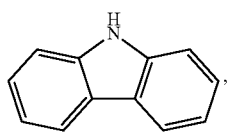, a chemical structural formula of the thermally activated delayed fluorescent green light polymer material is:

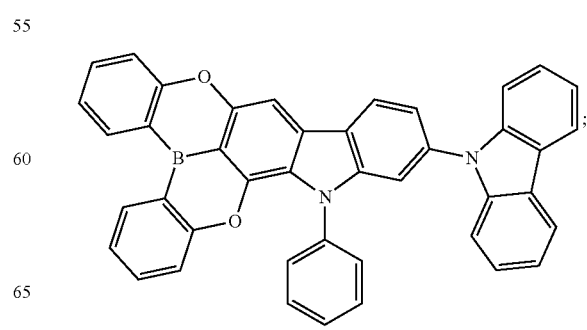;

when the benzene compound with the nitrogen-containing ring structure is phenoxazine, and a chemical structural formula of the phenoxazine is

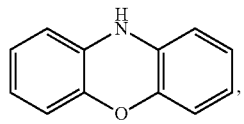 [SMILES: c1ccc2c(c1)Nc1ccccc1O2]

a chemical structural formula of the thermally activated delayed fluorescent green light polymer material is:

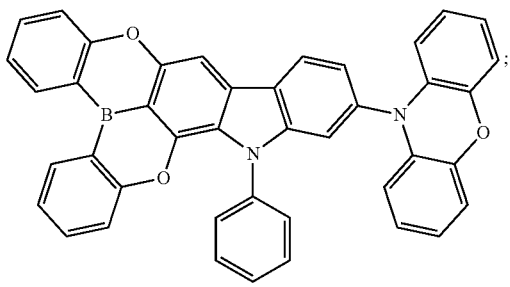 [SMILES: c1ccc(-n2c3cc(N4c5ccccc5Oc5ccccc54)ccc3c3cc4c5c(c32)Oc2ccccc2B5c2ccccc2O4)cc1]

and
when the benzene compound with the nitrogen-containing ring structure is 9,9'-dimethylacridine, and a chemical structural formula of the 9,9'-dimethylacridine is:

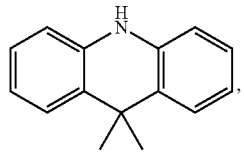 [SMILES: CC1(C)c2ccccc2Nc2ccccc21]

a chemical structural formula of the thermally activated delayed fluorescent green light polymer material is:

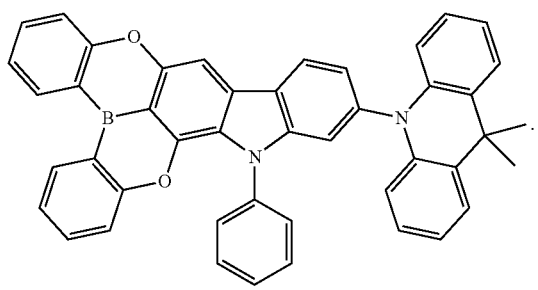 [SMILES: CC1(C)c2ccccc2N(c2ccc3c4cc5c6c(c4n(-c4ccccc4)c3c2)Oc2ccccc2B6c2ccccc2O5)c2ccccc21]

9. The preparation method for preparing the thermally activated delayed fluorescent green light polymer material according to claim 7, wherein a molar mass ratio of the benzene compound with the boron ring structure, the benzene compound with the nitrogen ring structure, the palladium acetate, and the tri-tert-butyl phosphine tetrafluoroborate is: (12-15):(15-20):(1-1.5):(3-4).

10. An organic electroluminescence device, comprising a light-emitting layer containing the thermally activated delayed fluorescent green light polymer material according to any one of claims 1.

11. The thermally activated delayed fluorescent green light polymer material according to claim 10, wherein the benzene compound with the nitrogen-containing ring structure is selected one of following structural formulas:

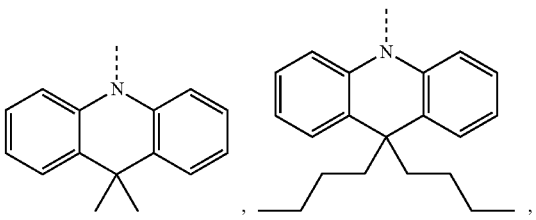

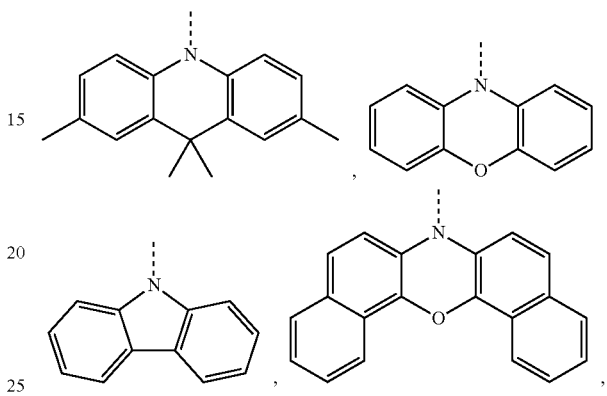

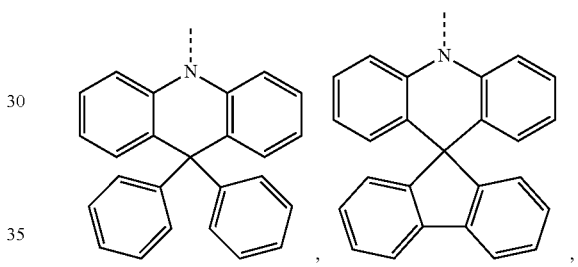

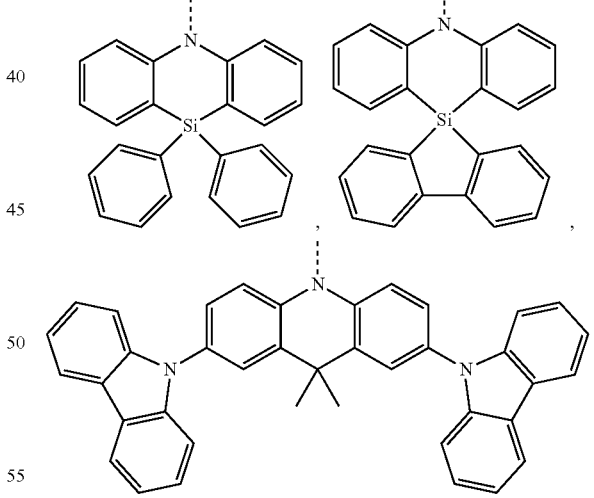

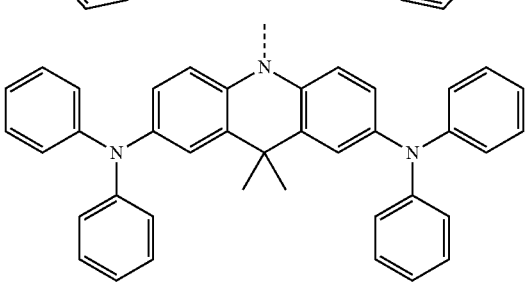

-continued

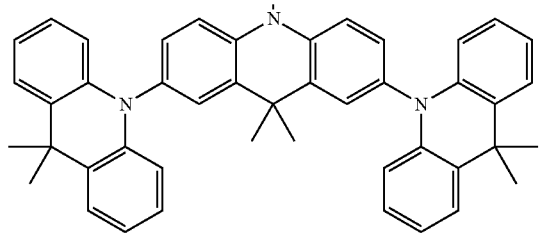

,

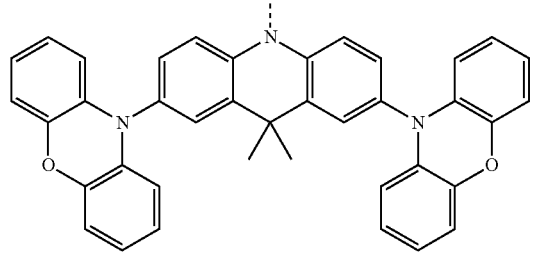

,

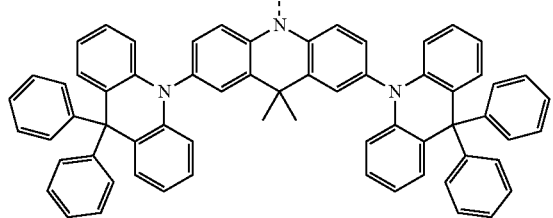

,

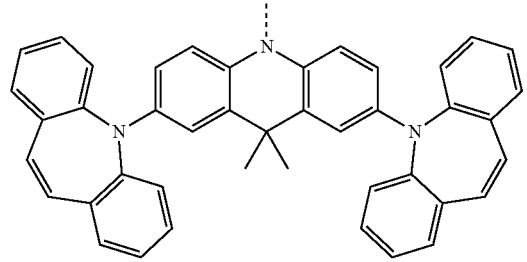

, and

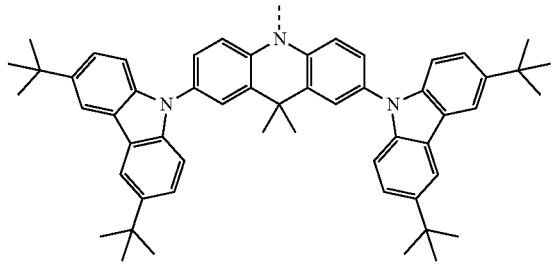

.

12. The thermally activated delayed fluorescent green light polymer material according to claim 11, wherein the R is

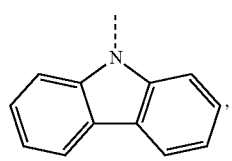

and
a chemical structural formula of the thermally activated delayed fluorescent green light polymer material is:

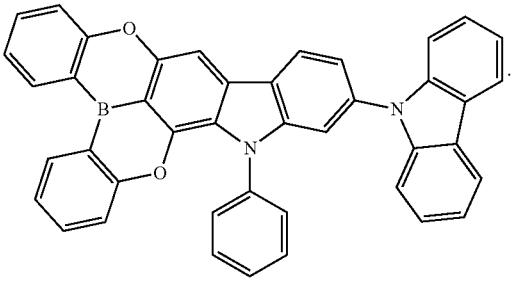 [SMILES: c1ccc(-n2c3cc(-n4c5ccccc5c5ccccc54)ccc3c3cc4c5c(c32)Oc2ccccc2B5c2ccccc2O4)cc1]

13. A thermally activated delayed fluorescent green light polymer material according to claim 11, wherein the R is

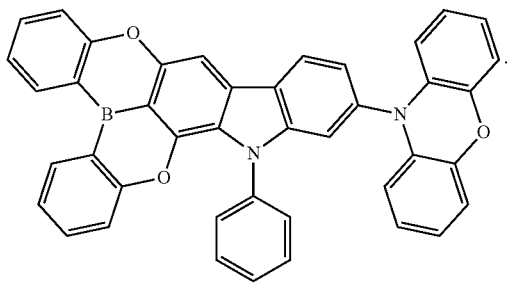 [SMILES: c1ccc(-n2c3cc(N4c5ccccc5Oc5ccccc54)ccc3c3cc4c5c(c32)Oc2ccccc2B5c2ccccc2O4)cc1]

, and
a chemical structural formula of the thermally activated delayed fluorescent green light polymer material is:

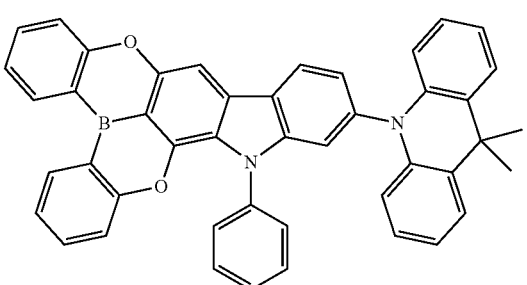

14. A thermally activated delayed fluorescent green light polymer material according to claim 11, wherein the R is

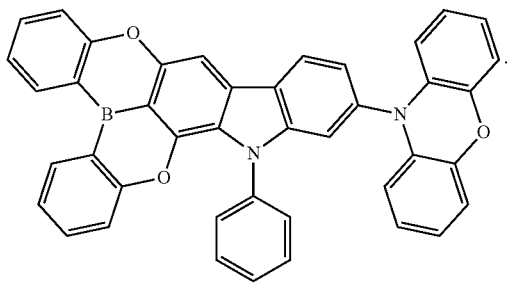 [SMILES: c1ccc(-n2c3cc(N4c5ccccc5Oc5ccccc54)ccc3c3cc4c5c(c32)Oc2ccccc2B5c2ccccc2O4)cc1]

, and
a chemical structural formula of the thermally activated delayed fluorescent green light polymer material is:

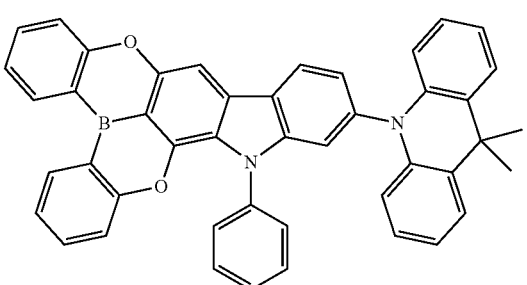

* * * * *